US008178374B2

(12) United States Patent
Min et al.

(10) Patent No.: US 8,178,374 B2
(45) Date of Patent: May 15, 2012

(54) THIN FILM PATTERNING METHOD AND METHOD FOR MANUFACTURING A LIQUID CRYSTAL DISPLAY DEVICE

(75) Inventors: Tae Yup Min, Beijing (CN); Zang Kyu Lim, Beijing (CN); Sung Hun Song, Beijing (CN); Xuesong Gao, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 189 days.

(21) Appl. No.: 12/571,694

(22) Filed: Oct. 1, 2009

(65) Prior Publication Data

US 2010/0093122 A1 Apr. 15, 2010

(30) Foreign Application Priority Data

Oct. 9, 2008 (CN) .......................... 2008 1 0223739

(51) Int. Cl.
*H01L 21/00* (2006.01)
(52) U.S. Cl. .................. 438/30; 438/670; 257/E21.025; 257/E21.535
(58) Field of Classification Search .................. 438/670, 438/736, 951, 945, 30; 216/40, 23; 257/E21.535, 257/E21.411, E21.025, E21.219, E21.039; 349/191, 46
See application file for complete search history.

(56) References Cited

U.S. PATENT DOCUMENTS

| 7,425,508 | B2 | 9/2008 | Ahn et al. |
| 7,531,394 | B2* | 5/2009 | Long et al. ................ 438/155 |
| 7,700,483 | B2* | 4/2010 | Cheng et al. ............... 438/670 |
| 2004/0125313 | A1 | 7/2004 | Lim |
| 2006/0139552 | A1* | 6/2006 | Ahn ............................ 349/149 |
| 2006/0205102 | A1* | 9/2006 | French et al. ................ 438/30 |
| 2007/0059611 | A1 | 3/2007 | Tung et al. |
| 2007/0205422 | A1* | 9/2007 | Ahn et al. ..................... 257/83 |
| 2007/0242178 | A1 | 10/2007 | Kawasaki et al. |
| 2008/0213472 | A1* | 9/2008 | Song ............................ 427/162 |
| 2009/0061548 | A1* | 3/2009 | Cheng et al. ................. 438/22 |

FOREIGN PATENT DOCUMENTS

| CN | 101149542 A | 3/2008 |
| CN | 101149546 A | 3/2008 |
| JP | 3-131765 B2 | 2/2001 |
| JP | 2003-255546 A | 9/2003 |
| JP | 2005-316445 A | 11/2005 |

* cited by examiner

*Primary Examiner* — Caridad Everhart
(74) *Attorney, Agent, or Firm* — Ladas & Parry LLP

(57) ABSTRACT

A thin film patterning method comprising: depositing a first thin film and applying a photoresist layer on the first thin film; exposing and developing the photoresist layer to define first, second and third regions, wherein the photoresist layer in the first region is thicker than that in the second region, and no photoresist layer is left in the third region; over-etching to remove the first thin film in the third region and form an over-etched region in the peripheral region of the first region; removing a part of the photoresist layer to expose the first thin film in the second region; depositing a second thin film so that the first thin film contacts the second thin film in the second region; and lifting off the photoresist layer to remove the second thin film in the first region and exposing the substrate in the over-etched region of the first region.

5 Claims, 12 Drawing Sheets

THIN FILM PATTERNING METHOD AND METHOD FOR MANUFACTURING A LIQUID CRYSTAL DISPLAY DEVICE

BACKGROUND

The present invention relates to a thin film patterning method and a method for manufacturing a liquid crystal display device, and in particular, to a thin film patterning method in which a composite layer structure having two different patterns is formed with a single mask, and a method for manufacturing a liquid crystal display device using the thin film patterning method.

Microelectronic technology is a new technology that develops along with integrated circuits, especially ULSI (ultra-large-scale integrated circuit). Microelectronic technology comprises a set of specialized technologies comprising system circuit designs, thin film patterning methods, materials preparation, automatic testing and packaging, and assembling etc. As microelectronic technology develops, its application expands gradually to manufacturing of other precision devices, such as a liquid crystal display device.

In microelectronic technology, a thin film is typically formed by sputtering, chemical vapor deposition or coating. The thin film is then patterned by a photolithograph process. The above two steps can be repeated to form an electronic component composed of multiple layers of thin films.

A conventional photolithograph process comprises following steps: applying a photoresist (PR) layer on a thin film; exposing and developing the photoresist layer with a mask so as to form a pattern in the photoresist layer; etching the thin film in accordance with the pattern in the photoresist layer to form a pattern in the thin film.

However, the mask used in the photolithograph process is expensive, and therefore the number of the masks used in the process has a significant influence on the manufacturing cost of an electronic component. In order to reduce cost, thin film patterning methods in which patterns are simultaneously formed in two different layers of thin films by using a single mask are proposed, such as a thin film patterning method using a dual-tone mask and a thin film patterning method using a lift-off process.

The thin film patterning method using a dual-tone mask comprises following steps: depositing a first thin film and a second thin film successively on a substrate; applying a photoresist layer on the second thin film, and exposing and developing the photoresist layer by using the dual-tone mask to form a photoresist pattern layer; etching the first and second thin film exposed by the photoresist pattern layer; removing a part of the photoresist pattern layer by ashing; etching the first and second thin film again exposed by the photoresist pattern layer; and stripping the photoresist pattern layer.

The thin film patterning method using a lift-off process comprises following steps: depositing a first thin film on a substrate; applying a photoresist layer on the first thin film, and exposing the photoresist layer by using a mask to form a photoresist layer; etching the first thin film exposed by the photoresist pattern layer; depositing a second thin film on the photoresist pattern layer and the substrate; and stripping the photoresist pattern layer along with the second thin film formed thereon by using the lift-off process.

With the thin film patterning method using the dual-tone mask, a region only with the second thin film can not be formed.

With the thin film patterning method using the lift-off process, a region in which the first and the second thin film overlaps as well as a region in which both of the first film and the second thin film are removed can not be formed.

SUMMARY

Therefore, one of the objects of the present invention is to provide a thin film patterning method by which two layers of thin films can be patterned simultaneously with a single mask, while a region in which two thin films overlaps, a region in which there is only one thin film, and a region in which both of the two thin films are removed can be formed simultaneously by using a dual tone mask, a lift-off process and an over-etching process.

In one aspect, the embodiment of the present invention provides a thin film patterning method, comprising: step 1 of depositing a first thin film on a substrate, and applying a photoresist layer on the first thin film; step 2 of exposing and developing the photoresist layer by using a dual tone mask to define a first region, a second region and a third region, wherein the photoresist layer in the first region is thicker than the photoresist layer in the second region, and there is no photoresist layer left in the third region; step 3 of over-etching the first thin film to remove the first thin film in the third region and form an over-etched region in the peripheral region of the first region; step 4 of removing a part of the photoresist layer by ashing to expose the first thin film in the second region; step 5 of depositing a second thin film so that the first thin film contacts the second thin film in the second region; and step 6 of lifting off the photoresist layer to remove the second thin film in the first region and expose the substrate in the over-etched region in the peripheral region of the first region.

In step 3, a pattern composed of the first thin film may be formed in a peripheral region of the first region adjacent to the second region.

In step 3, the substrate may be exposed in a peripheral region of the first region adjacent to the third region.

In step 3, the first thin film may be over-etched by a wet etching process.

In step 3, the first thin film may have a bias of 3 μm or more using said over-etching process.

In another aspect, the embodiment of the present invention also provides a method for manufacturing a liquid crystal display device comprising following steps.

In step 1, a common electrode transparent conductive layer is deposited on a substrate, and a photoresist layer is applied on the common electrode transparent conductive layer.

In step 2, the photoresist layer is exposed and developed using a dual tone mask to define a first region, a second region and a third region, so that the photoresist layer in the first region is thicker than the photoresist layer in the second region and there is no photoresist layer left in the third region.

In step 3, the common electrode transparent conductive layer is over-etched to remove the common electrode transparent conductive layer in the third region and form an over-etched region in the peripheral region of the first region.

In step 4, a part of the photoresist layer is removed by ashing to expose the common electrode transparent conductive layer in the second region.

In step 5: a gate metal layer is deposited so that the common electrode transparent conductive layer contacts the gate metal layer in the second region.

In step 6, the photoresist layer is lifted off so as to remove the gate metal layer in the first region and expose the substrate in the over-etched region in the peripheral region of the first region, so that gate lines, common electrode lines and common electrodes contacting the common electrode lines are formed.

In step 7, thin film transistors comprising a source/drain electrode metal layer is formed on the resultant structure of step 6.

In step 8, pixel electrodes are formed on the resultant structure of step 7.

In yet another aspect, the embodiment of the present invention also provides a method for manufacturing a liquid crystal display device comprising following steps.

In step 1, gate lines are formed on a substrate.

In step 2, a source/drain electrode metal layer is deposited on the substrate, and a photoresist layer is applied on the source/drain electrode metal layer;

In step 3, the photoresist layer is exposed and developed using a dual tone mask to define a first region, a second region and a third region, wherein the photoresist layer in the first region is thicker than the photoresist layer in the second region and there is no photoresist layer left in the third region.

In step 4, the source/drain electrode metal layer is over-etched to remove the source/drain electrode metal layer in the third region and form an over-etched region in the peripheral region of the first region.

In step 5, a part of the photoresist layer is removed by ashing to expose the source/drain electrode metal layer in the second region.

In step 6: a pixel electrode transparent conductive layer is deposited so that the source/drain electrode metal layer contacts the pixel electrode transparent conductive layer in the second region.

In step 7, the photoresist layer is lifted off so as to remove the pixel electrode transparent conductive layer in the first region and expose the substrate in the over-etched region in the peripheral region of the first region, so that thin film transistors and pixel electrodes are formed.

In step 8, the channels of the thin film transistors and common electrodes are formed on the resultant structure of step 7.

In yet another aspect, the embodiment of the present invention also provides a method for manufacturing a liquid crystal display device comprising following steps.

In step 1, gate lines are formed on a substrate.

In step 2, a source/drain electrode metal layer is deposited on the substrate, and a photoresist layer is applied on the source/drain electrode metal layer;

In step 3, the photoresist layer is exposed and developed using a dual tone mask to define a first region, a second region and a third region, so that the photoresist layer in the first region is thicker than the photoresist layer in the second region and there is no photoresist layer left in the third region.

In step 4, the source/drain electrode metal layer is over-etched to remove the source/drain electrode metal layer in the third region and form an over-etched region in the peripheral region of the first region.

In step 5, a part of the photoresist layer is removed by ashing to expose the source/drain electrode metal layer in the second region.

In step 6: a pixel electrode transparent conductive layer is deposited so that the source/drain electrode metal layer contacts the pixel electrode transparent conductive layer in the second region.

In step 7, the photoresist layer is lifted off so as to remove the pixel electrode transparent conductive layer in the first region and expose the substrate in the over-etched region in the peripheral region of the first region, so that thin film transistors and pixel electrodes are formed.

In step 8, the channels of the thin film transistors are formed on the resultant structure of step 7.

With the thin film patterning method according to the embodiments of the present invention, a pattern composed of the first thin film is formed in the center area of the first region by an over-etching process; a pattern composed of the second thin film is formed in the center area of the third region by a lift off process; and a pattern composed of the first film and the second thin film is formed in the second region, thereby obtaining a composite layer structure having two different patterns.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

The First Embodiment

Figure 1:
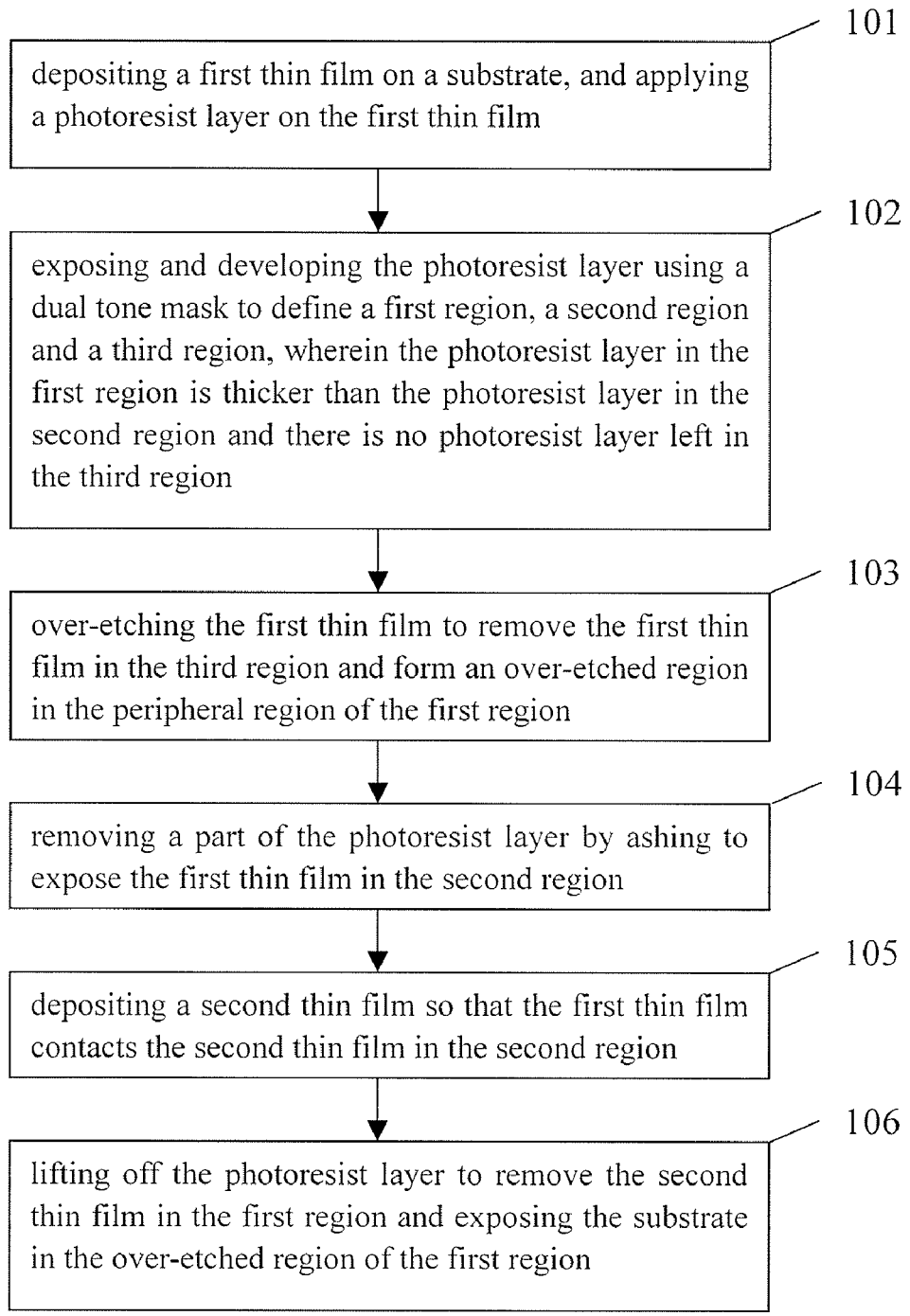
FIG. 1 is a schematic flow chart of a thin film patterning method according to a first embodiment of the present invention.

FIG. 1 is a schematic flow chart of the thin film patterning method according to the first embodiment of the present invention. As shown in FIG. 1, the thin film patterning method comprises following steps.

In step 101, a first thin film is deposited on a clean substrate, and a photoresist layer is applied on the substrate having the first thin film deposited thereon.

In step 102, the photoresist layer is exposed and developed using a dual-tone mask to define three regions in the photoresist layer with different thickness, that is, a first region corresponding to a non-transmissive region of the dual-tone mask, a second region corresponding to a semi-transmissive region of the dual-tone mask, and a third region corresponding to a transmissive region of the dual-tone mask.

Figure 2A:
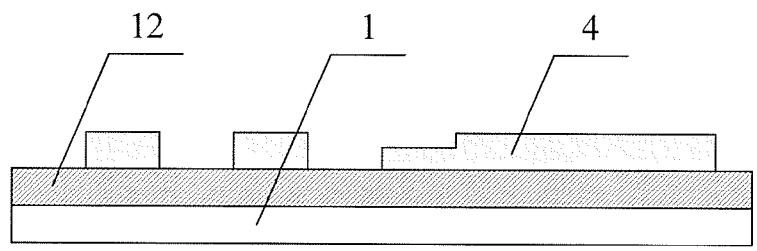
FIG. 2a is a schematic cross sectional view of a substrate after step 102 according to the first embodiment of the present invention.

FIG. 2a is a schematic cross sectional view of the substrate after step 102 according to the first embodiment of the present invention. As shown in FIG. 2a, after the photoresist layer is exposed and developed, the photoresist layer in the first region is thicker than the photoresist layer in the second region, and there is no photoresist layer left in the third region.

In step 103, the first thin film is over etched using a wet etching process.

Figure 2B:
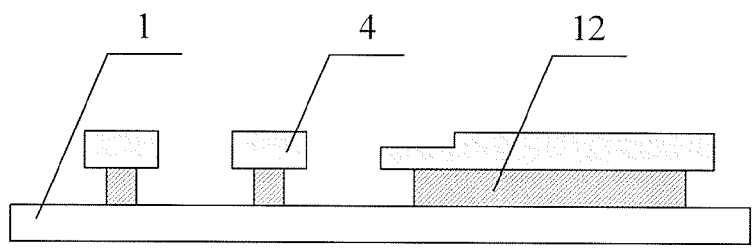
FIG. 2b is a schematic cross sectional view of the substrate after step 103 according to the first embodiment of the present invention.

FIG. 2b is a schematic cross sectional view of the substrate after step 103 according to the first embodiment of the present invention. As shown in FIG. 2b, after the first thin film is over-etched, the first thin film 12 is completely removed from the third region, and a part of the first thin film 12 is removed in the peripheral region of the first region and the second region so as to form an over-etched region and a pattern composed of the first thin film 12. During over-etching, the etching bias can be 3 µm or more.

In step 104, a part of the photoresist layer is removed by ashing. At this time, there is still some photoresist left in the first region, while there is no photoresist layer left in the second region, thus exposing the first thin film in the second region.

In step 105, a second thin film is deposited.

Figure 2C:
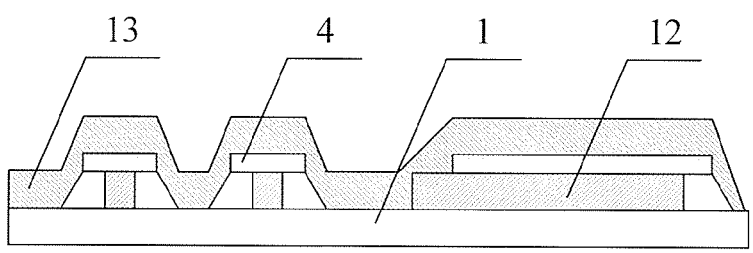
FIG. 2c is a schematic cross sectional view of the substrate after step 105 according to the first embodiment of the present invention.

FIG. 2c is a schematic cross sectional view of the substrate after step 105 according to the first embodiment of the present invention. As shown in FIG. 2c, after the second thin film 13 is deposited on the resultant structure of step 104, the first thin film 12 contacts the second thin film 13 in the second region.

In step 106, the photoresist layer is lifted off.

Figure 2D:
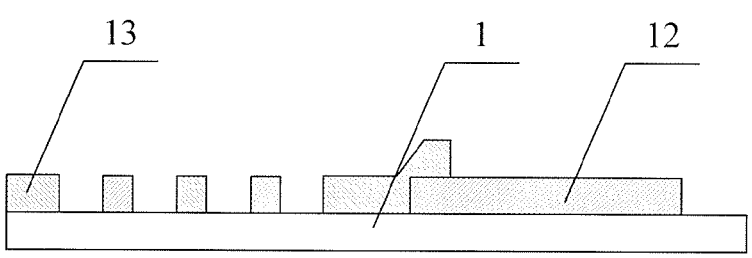
FIG. 2d is a schematic cross sectional view of the substrate after step 106 according to the first embodiment of the present invention.

FIG. 2d is a schematic cross sectional view of the substrate after step 106 according to the first embodiment of the present invention. As shown in FIG. 2d, when the photoresist layer is lifted off, the second thin film 13 in the first region is removed, thereby exposing the substrate in the over-etched region of the first region, and forming a pattern composed of the second film 13.

According to the thin film patterning method according to the first embodiment of the present invention, a pattern composed of the first thin film is formed in the center area of the first region by over-etching, and a pattern composed of the second thin film is formed in the center area of the third region by a lift off process, and a pattern composed of the first thin film and the second thin film is formed in the second region, thereby obtaining a composite layer structure having two different patterns.

Comparing with the conventional thin film patterning method using a dual-tone mask, a pattern composed of the second thin film is formed in the third region according to the thin film patterning method of the first embodiment. Comparing with the conventional thin film patterning method using a lift-off process, in the thin film patterning method of the first embodiment, a pattern composed of the first film and the second thin film is formed in the second region, and both the first film and the second thin film are removed, thus exposing the substrate.

During over-etching in step 103 of the first embodiment, the first thin film in the peripheral region of the first region adjacent to the third region is etched, and in the subsequent steps, the substrate is exposed in the peripheral region of the first region adjacent to the third region; while the first thin film in the peripheral region of the first region adjacent to the second region is not etched, and thus in the subsequent steps, a pattern composed of the first thin film is formed in the peripheral region of the first region adjacent to the second region.

In step 103 of the first embodiment, the etching bias can be about 3 μm in the wet etching process, whereas it is necessary to control the bias to be 3 μm or more in the first embodiment.

In the first embodiment, a glass substrate or a quartz substrate can be used as the substrate depending on the applications of the thin film patterning method.

The Second Embodiment

The method for manufacturing a liquid crystal display device according to the second embodiment of the present invention employs the thin film patterning method according to the first embodiment of the present invention, and comprises the step of forming gate lines and common electrodes, the step of form data lines and thin film transistors (TFTs), and the step of forming pixel electrodes.

In particular, the step of forming gate lines and common electrodes comprises the following steps.

In step 201, a common electrode transparent conductive layer is deposited on a clean transparent substrate, and a photoresist layer is uniformly applied on the side of the substrate with the common electrode transparent conductive layer.

In step 202, the photoresist layer is exposed and developed using a dual tone mask. The dual-tone mask can divided into a transmissive region, a semi-transmissive region and a non-transmissive region. Depending on the formation of the semi-transmissive region, the dual-tone mask can be classified as a gray tone mask or a half tone mask.

Figure 3A:
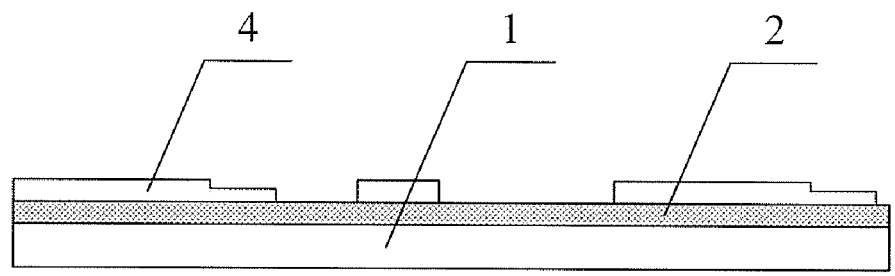
FIG. 3a is a schematic cross sectional view of a substrate after step 202 according to a second embodiment of the present invention.

FIG. 3*a* is a schematic view of the substrate after step 202 according to the second embodiment of the present invention. As shown in FIG. 3*a*, after the photoresist layer is exposed and developed using a dual tone mask, the photoresist layer 4 is left in both a display region and an isolating region between the gate lines and common electrode lines, while there is no photoresist left in the gate line region and the common electrode line region. The photoresist layer 4 is relatively thin in a connection portion of the common electrodes and relatively thick in the other regions.

In step 203, the transparent conductive layer exposed by the photoresist layer is over etched.

Figure 3B:
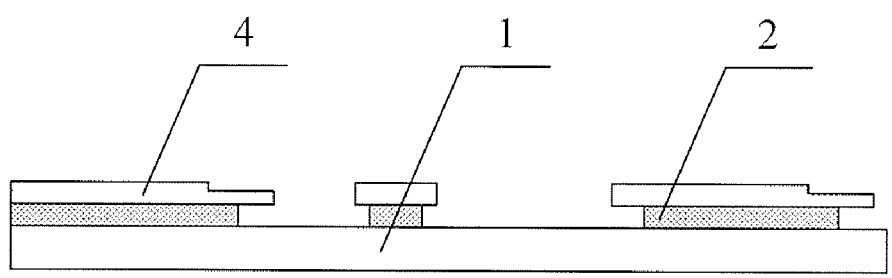
FIG. 3b is a schematic cross sectional view of the substrate after step 203 according to the second embodiment of the present invention.

FIG. 3*b* is a schematic view of the substrate after step 203 according to the second embodiment of the present invention. As shown in FIG. 3*b*, after the photoresist layer 4 is over-etched, the common electrode transparent conductive layer 2 is removed in the gate line region and the common electrode line region, and an over-etched region is formed in the peripheral region of the display region and the isolating region. During over-etching, the etching bias can be 3 μm or more.

In step 204, a part of the photoresist layer is removed by ashing.

Figure 3C:
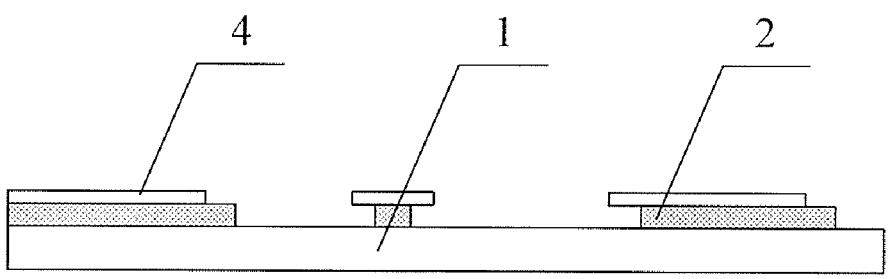
FIG. 3c is a schematic cross sectional view of the substrate after step 204 according to the second embodiment of the present invention.

FIG. 3*c* is a schematic view of the substrate after step 204 according to the second embodiment of the present invention. As shown in FIG. 3*c*, after a part of the photoresist layer 4 is removed by ashing, the photoresist layer 4 is still left in the common electrodes and the isolating region, while the common electrode transparent conductive layer 2 is exposed in the connection portion for the common electrodes.

In step 205, a gate metal layer is deposited on the entire surface of the substrate after a part of the photoresist layer 4 is removed by ashing.

Figure 3D:
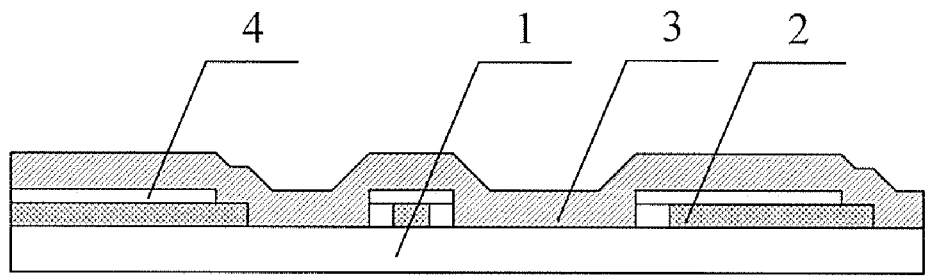
FIG. 3d is a schematic cross sectional view of the substrate after step 205 according to the second embodiment of the present invention.

FIG. 3*d* is a schematic view of the substrate after step 205 according to the second embodiment of the present invention. As shown in FIG. 3*d*, the gate metal layer 3 in thee connection portion of the common electrode contacts the common electrode transparent conductive layer 2, after the gate metal layer 3 is deposited.

In step 206, the remaining photoresist layer is lifted off.

Figure 3E:
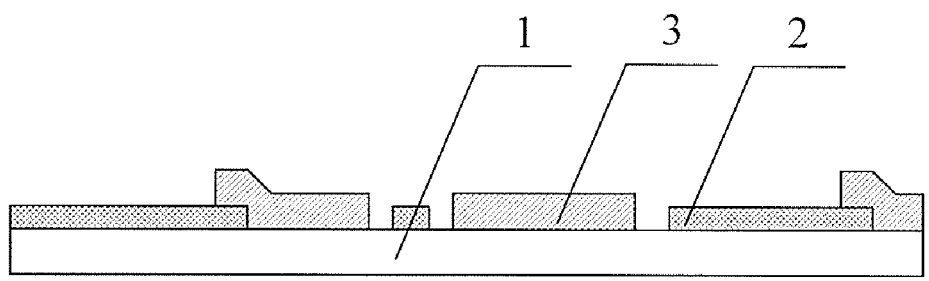
FIG. 3e is a schematic cross sectional view of the substrate after step 206 according to the second embodiment of the present invention.

FIG. 3*e* is a schematic view of the substrate after step 206 according to the second embodiment of the present invention. As shown in FIG. 3*e*, when the photoresist layer is lifted off, the gate metal layer 3 on the photoresist layer is removed simultaneously, thereby forming the gate lines and the common electrode lines electrically connected to the common electrodes. At this time, the gate lines and the common electrode lines are insulated from each other by the isolating region.

In particular, the step of forming data lines and thin film transistors comprises following steps.

In step 207, a gate insulating layer, a semiconductor layer, a doped semiconductor layer and a source/drain electrode metal layer are successively deposited on the substrate after step 206, and then a photoresist layer is uniformly applied thereon. The photoresist layer is exposed and developed using a dual-tone mask.

Figure 3F:
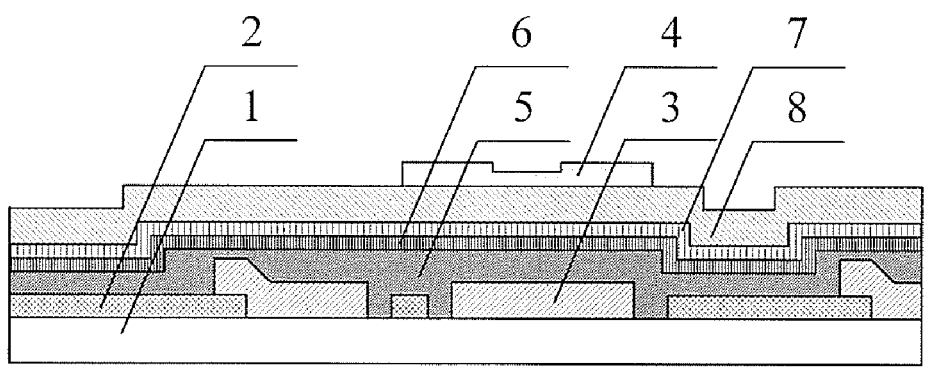
FIG. 3f is a schematic cross sectional view of the substrate after step 207 according to the second embodiment of the present invention.

FIG. 3*f* is a schematic view of the substrate after step 207 according to the second embodiment of the present invention. As shown in FIG. 3*f*, after the photoresist layer 4 is exposed and developed, the photoresist layer 4 is left in the data line region and the thin film transistor region. The photoresist layer 4 is relatively thin in the channel region of the thin film transistors and relatively thick in the other regions.

In step 208, the source/drain electrode metal layer, the doped semiconductor layer and the semiconductor layer are etched successively. At this time, silicon islands and the data lines are formed.

In step 209, the channel region of the thin film transistors is exposed after a part of the photoresist layer is removed by ashing. The source/drain electrode metal layer, the doped semiconductor layer and a part of the semiconductor layer are etched successively, and then the photoresist layer is stripped.

Figure 3G:
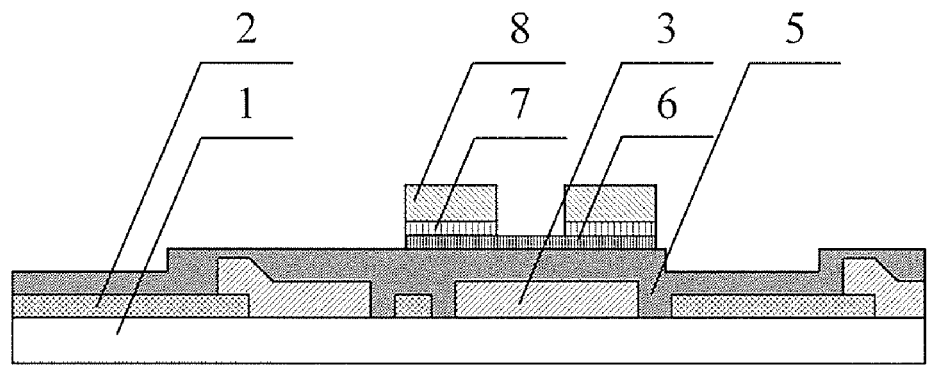
FIG. 3g is a schematic cross sectional view of the substrate after step 209 according to the second embodiment of the present invention.

FIG. 3*g* is a schematic view of the substrate after step 209 according to the second embodiment of the present invention. As shown in FIG. 3*g*, after step 209, the semiconductor layer 6 is exposed in the channel region of the thin film transistors, thereby forming the thin film transistors, drain electrodes, and source electrodes electrically connected to the data lines are formed.

In particular, the step of forming pixel electrodes comprises step 210 of depositing a passivation layer on the substrate after step 209, and then applying photoresist layer uniformly on the passivation layer. The photoresist layer is exposed and developed using a dual-tone mask.

Figure 3H:
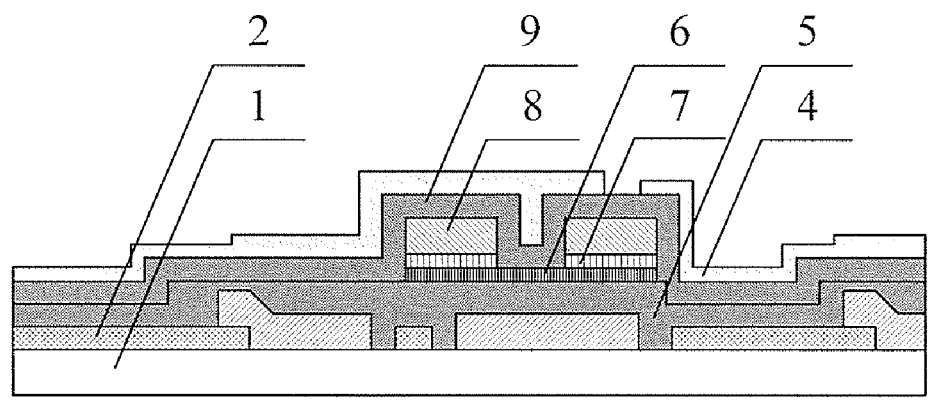
FIG. 3h is a schematic cross sectional view of the substrate after step 210 according to the second embodiment of the present invention.

FIG. 3*h* is a schematic view of the substrate after step 210 according to the second embodiment of the present invention. As shown in FIG. 3*h*, after step 210, the passivation layer is exposed in a via region of the drain electrodes, while the photoresist layer is left in the other regions. Further, the photoresist layer 4 is relatively thin in the display region while the photoresist layer 4 is relatively thick in the other regions.

In step 211, the passivation layer is etched to form vias exposing the source/drain electrode metal layer. Then, a part of the photoresist layer is removed by ashing.

Figure 3I:
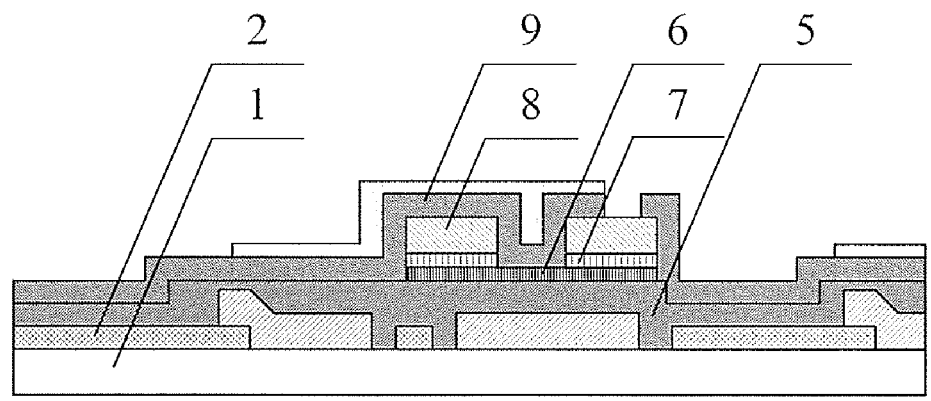
FIG. 3i is a schematic cross sectional view of the substrate after step 211 according to the second embodiment of the present invention.

FIG. 3*i* is a schematic view of the substrate after step 211 according to the second embodiment of the present invention.

As shown in FIG. 3i, after step 211, the passivation in the display region is further exposed.

In step 212, a pixel electrode transparent conductive layer is deposited subsequently on the substrate after step 211, and the left photoresist layer is lifted off.

Figure 3J:
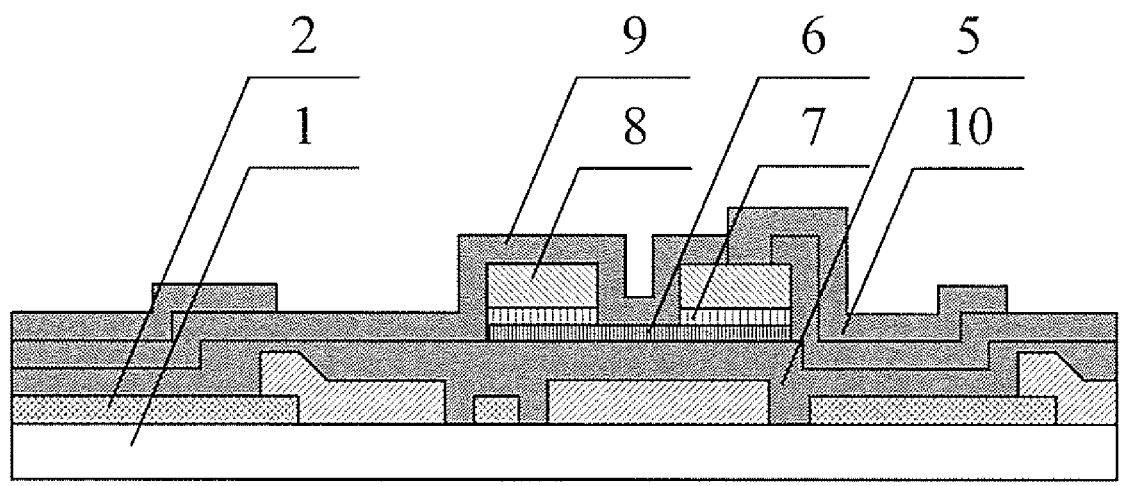
FIG. 3j is a schematic cross sectional view of the substrate after step 212 according to the second embodiment of the present invention.

FIG. 3j is a schematic view of the substrate after step 212 according to the second embodiment of the present invention. As shown in FIG. 3j, when the photoresist layer is lifted off, the pixel electrode transparent conductive layer 10 on the photoresist layer is removed simultaneously, thereby forming pixel electrodes electrically connected to the drain electrodes through vias.

The second embodiment provides a method for manufacturing a liquid crystal display array substrate in which the thin film patterning method according to the first embodiment is used to form gate lines and common electrode.

The array substrate manufactured according to the second embodiment is an array substrate of a twisted nematic type liquid crystal display device. Furthermore, an array substrate of a fringe field switching type liquid crystal display device can be made if pixel electrodes are formed with slits in the step of forming pixel electrodes.

Furthermore, a transflective array substrate for a liquid crystal display device can be made, if the common electrode transparent conductive layer is formed in a portion of the display region while the gate metal layer is formed in the other portion of the display region in the step of forming gate lines and common electrodes. A gate metal layer with high reflectivity, such as aluminum, may be deposited in step 205 to enhance the reflectivity. Metal material with a reflectivity over 30% is preferred.

The Third Embodiment

The method for manufacturing a liquid crystal display device according to the third embodiment of the present invention employs the thin film patterning method according to the first embodiment of the present invention, and comprises the step of forming gate lines, the step of forming data lines and pixel electrodes and the step of forming thin film transistors.

In particular, the step of forming gate lines comprises following step.

In step 301, a gate metal layer is deposited on a clean and transparent substrate. A photoresist layer is uniformly applied on the gate metal layer. The photoresist layer is exposed and developed using a full tone mask. At this time, the photoresist layer is left only in the gate line region. Then, the gate metal layer is etched to form the gate lines. Finally, the photoresist layer is stripped.

Figure 4A:
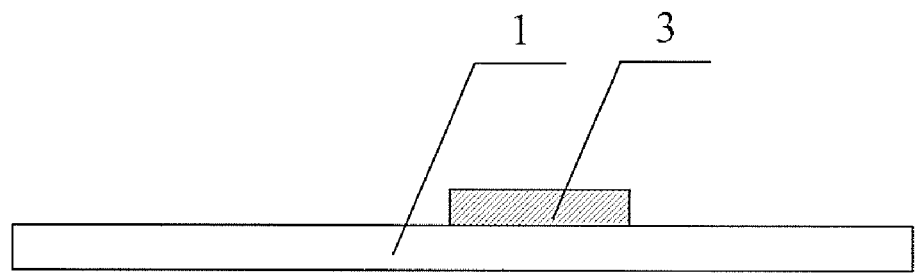
FIG. 4a is a schematic cross sectional view of a substrate after step 301 according to a third embodiment of the present invention.

FIG. 4a is a schematic view of the substrate after step 301 according to the third embodiment of the present invention. As shown in FIG. 4a, the gate lines are formed in the gate line region of the substrate.

In particular, the step of forming data lines and pixel electrodes comprises the following step.

In step 302, a gate insulating layer, a semiconductor layer, a doped semiconductor layer and a source/drain electrode metal layer are deposited successively on the resultant structure of step 301. A photoresist layer is uniformly applied thereon and then subjected to exposing and developing process using a dual tone mask.

Figure 4B:
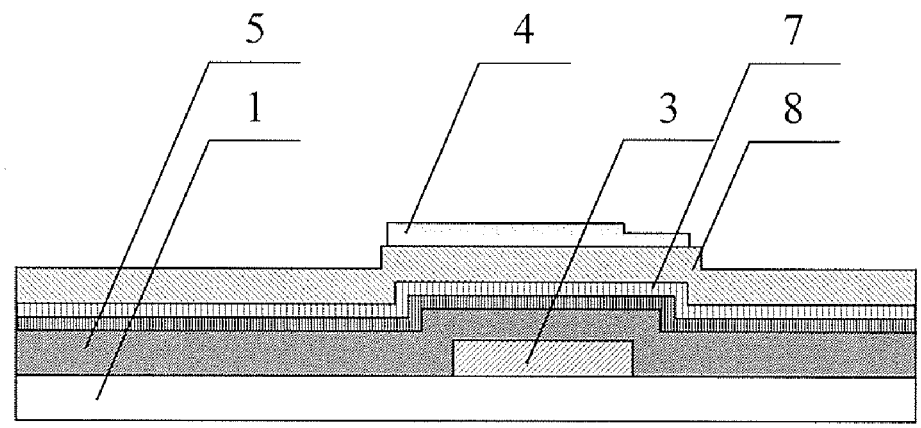
FIG. 4b is a schematic cross sectional view of the substrate after step 302 according to the third embodiment of the present invention.

FIG. 4b is a schematic view of the substrate after step 302 according to the third embodiment of the present invention. As shown in FIG. 4b, after the photoresist layer 4 is exposed and developed, the photoresist layer 4 is left on the data lines, the source/drain electrodes and channels of the thin film transistors, and the photoresist layer 4 in a connection portion of the drain electrodes is relatively thinner.

In step 303, the source/drain metal layer is over-etched, and then the doped semiconductor layer and the semiconductor layer are etched successively.

Figure 4C:
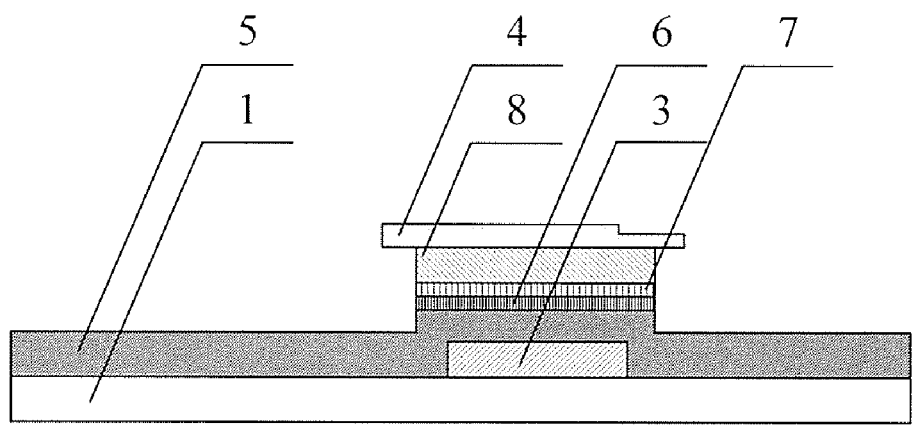
FIG. 4c is a schematic cross sectional view of the substrate after step 303 according to the third embodiment of the present invention.

FIG. 4c is a schematic view of the substrate after step 303 according to the third embodiment of the present invention. As shown in FIG. 4c, after step 303, the data lines are formed. At this time, an over-etched region is formed under the photoresist layer 4.

In step 304, a part of the photoresist layer is removed by ashing and the pixel electrode transparent conductive layer is deposited.

Figure 4D:
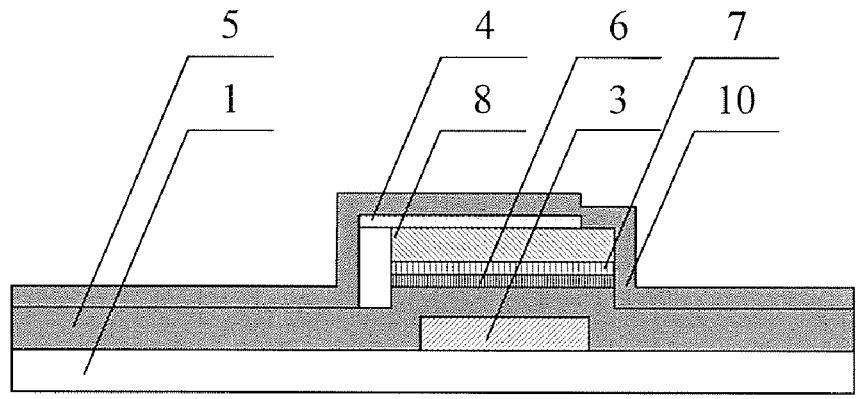
FIG. 4d is a schematic cross sectional view of the substrate after step 304 according to the third embodiment of the present invention.

FIG. 4d is a schematic view of the substrate after step 304 according to the third embodiment of the present invention. As shown in FIG. 4d, after a part of the photoresist layer is removed by ashing, the connection portion of the drain electrodes is exposed. After the pixel electrode transparent conductive layer 10 is deposited, the pixel electrode transparent conductive layer 10 contacts the source/drain electrode metal layer 8 in the connection portion of the drain electrodes.

In step 305, the photoresist layer is lifted off.

Figure 4E:
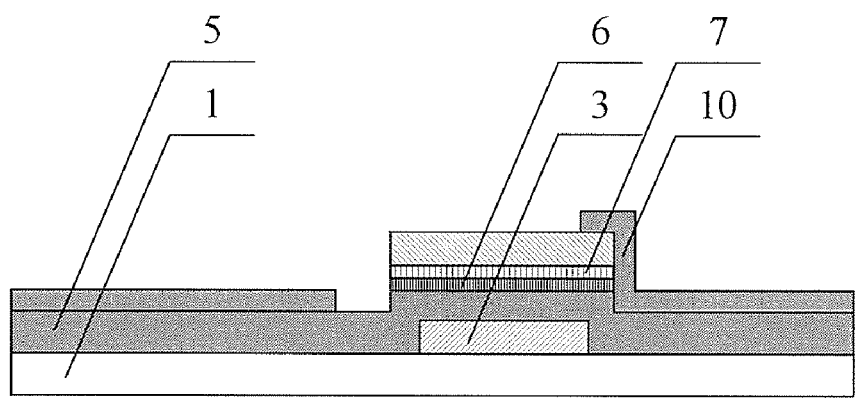
FIG. 4e is a schematic cross sectional view of the substrate after step 305 according to the third embodiment of the present invention.

FIG. 4e is a schematic view of the substrate after step 305 according to the third embodiment of the present invention. As shown in FIG. 4e, when the photoresist layer is lifted off, the pixel electrode transparent conductive layer 10 on the photoresist layer is removed simultaneously, and the gate insulating layer 5 is exposed in the over-etched region, so that the pixel electrodes electrically connected to the drain electrodes are formed.

In particular, the step of forming thin film transistors comprises following steps.

In step 306, a photoresist layer is applied uniformly o the substrate after step 305, and then subjected to a exposing and developing process using a full tone mask.

Figure 4F:
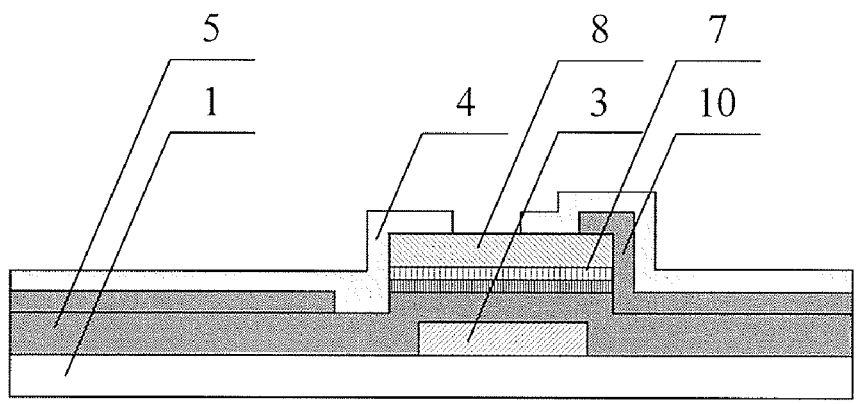
FIG. 4f is a schematic cross sectional view of the substrate after step 306 according to the third embodiment of the present invention.

FIG. 4f is a schematic view of the substrate after step 306 according to the third embodiment of the present invention. As shown in FIG. 4f, after the photoresist layer 4 is exposed and developed, the source/drain electrode metal layer 8 is exposed in a channel region of the thin film transistors, while the other regions are all covered by the photoresist layer.

In step 307, the source/drain electrode metal layer, the doped semiconductor layer and a part of the semiconductor layer are etched successively to form channels of the thin film transistors.

In step 308, a passivation layer is deposited subsequently on the resultant structure of step 307 and then the photoresist layer is lifted off.

Figure 4G:
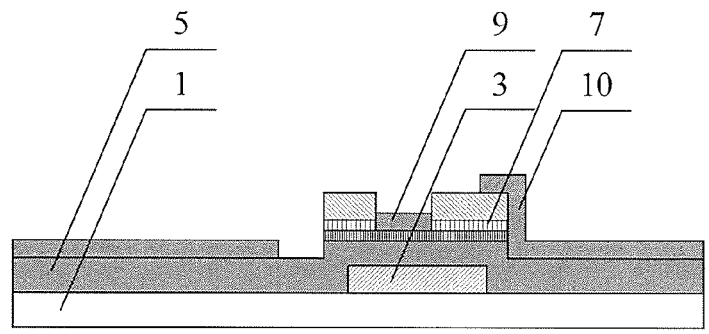
FIG. 4g is a schematic cross sectional view of the substrate after step 308 according to the third embodiment of the present invention.

FIG. 4g is a schematic view of the substrate after step 308 according to the third embodiment of the present invention. As shown in FIG. 4g, when the photoresist 4 is lifted off, the passivation layer 9 on the photoresist layer 4 is removed simultaneously. After the photoresist layer is lifted off, the passivation 9 is formed in the channel region of the thin film transistors.

The third embodiment provides a method for manufacturing an array substrate for a liquid crystal display device using the thin film patterning method according to the first embodiment to form the data lines and the pixel electrodes, thereby completing the manufacturing of the array substrate.

The array substrate manufactured according to the second embodiment is an array substrate of a twisted nematic type liquid crystal display device. Furthermore, an array substrate of a fringe field switching type liquid crystal display device can be made if the common electrode is formed in the display region in the step of forming gate lines, and the pixel electrodes are formed with slits in the step of forming pixel electrodes.

Furthermore, a transflective array substrate for a liquid crystal display device can be made, if the gate metal layer is formed in a portion of the display region while the gate metal layer is formed in the other portion of the display region in the step of forming gate lines and common electrodes. A gate metal layer with high reflectivity, such as aluminum, may be deposited in step 301 to enhance the reflectivity. Metal material with a reflectivity over 30% is preferred.

The Fourth Embodiment

The method for manufacturing a liquid crystal display device according to the fourth embodiment of the present invention employs the thin film patterning method according to the first embodiment of the present invention, and comprises the step of form gate lines, the step of forming data lines and pixel electrodes, and the step of forming thin film transistors and common electrodes.

In particular, the step of forming gate lines comprises following steps.

In step 401, a gate metal layer is deposited on a clean and transparent substrate. A photoresist layer is uniformly applied on the gate metal layer, and is subject to an exposing and developing process using a full tone mask. At this time, the photoresist layer is left only in a gate line region. Then, the exposed gate metal layer is etched to form the gate lines. Then, the photoresist layer is stripped.

Figure 5A:
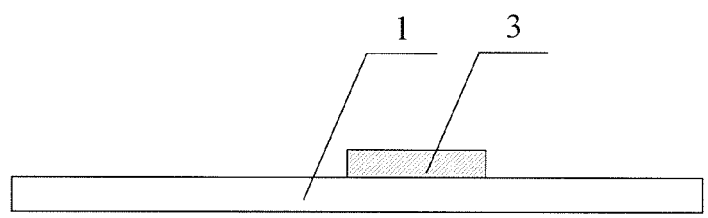
FIG. 5a is a schematic cross sectional view of a substrate after step 401 according to a fourth embodiment of the present invention.

FIG. 5a is a schematic view of the substrate after step 401 according to the fourth embodiment of the present invention. As shown in FIG. 5a, after step 401, the gate lines are formed in the gate line region of the substrate.

In particular, the step of forming data lines and pixel electrodes comprises following steps.

In step 402, a gate insulating layer, a semiconductor layer, a doped semiconductor layer and a source/drain metal layer are deposited successively on the substrate after step 401. A photoresist layer is uniformly applied thereon and is subjected to an exposing and developing process using a dual tone mask.

Figure 5B:
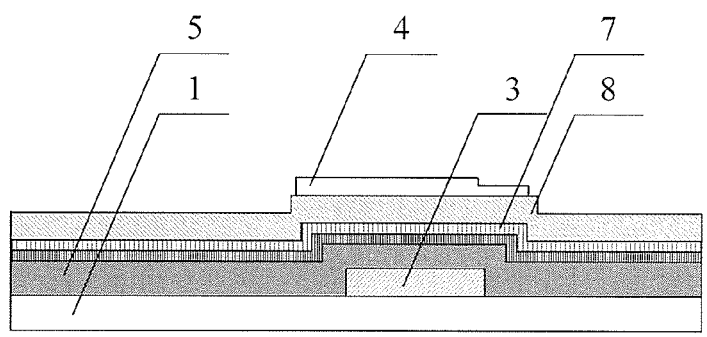
FIG. 5b is a schematic cross sectional view of the substrate after step 402 according to the fourth embodiment of the present invention.

FIG. 5b is a schematic view of the substrate after step 402 according to the fourth embodiment of the present invention. As shown in FIG. 5b, after the photoresist layer 4 is exposed and developed, the photoresist layer 4 is left on the data lines, the source/drain electrodes and channels of the thin film transistors, and the photoresist layer 4 is relatively thin in a connection portion of the drain electrodes.

In step 403, the source/drain electrode metal layer is over etched, and then the doped semiconductor layer and the semiconductor layer are etched successively.

Figure 5C:
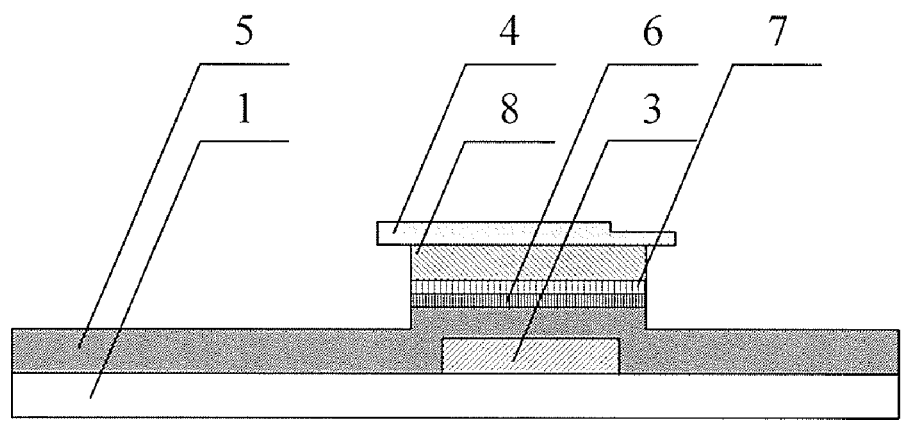
FIG. 5c is a schematic cross sectional view of the substrate after step 403 according to the fourth embodiment of the present invention.

FIG. 5c is a schematic view of the substrate after step 403 according to the fourth embodiment of the present invention. As shown in FIG. 5c, after step 403, the data lines are formed. At this time, an over-etched region is formed under the photoresist layer 4.

In step 404, a pixel electrode transparent conductive layer is deposited after a part of the photoresist layer is removed by aching.

Figure 5D:
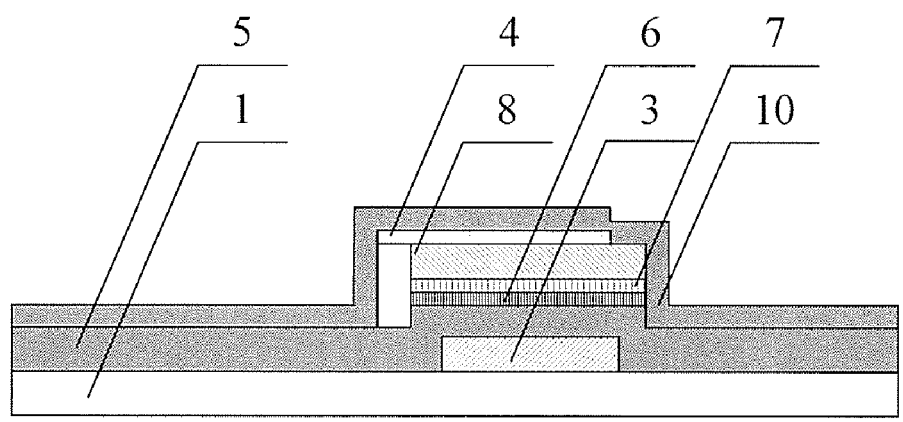
FIG. 5d is a schematic cross sectional view of the substrate after step 404 according to the fourth embodiment of the present invention.

FIG. 5d is a schematic view of the substrate after step 404 according to the fourth embodiment of the present invention. As shown in FIG. 5d, after a part of the photoresist layer 4 is removed by ashing, a connection portion of the drain electrode is exposed. After the pixel electrode transparent conductive layer 10 is deposited, the pixel electrode transparent conductive layer 10 contacts the source/drain electrode metal layer 8 in the connection portion of the drain electrode.

In step 405, the photoresist layer is lifted off.

Figure 5E:
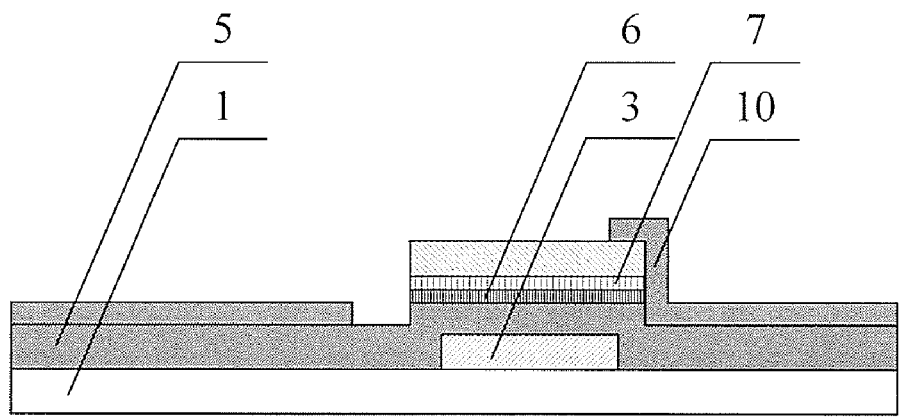
FIG. 5e is a schematic cross sectional view of the substrate after step 405 according to the fourth embodiment of the present invention.

FIG. 5e is a schematic view of the substrate after step 405 according to the fourth embodiment of the present invention. As shown in FIG. 5e, when the photoresist layer is lifted off, the pixel electrode transparent conductive layer 10 on the photoresist layer is removed simultaneously, and the gate insulating layer 5 is exposed in the over-etched region, thereby forming pixel electrodes electrically connected to the drain electrodes.

In particular, the step of forming thin film transistors and common electrodes comprises following steps.

In step 406, a passivation layer and a common electrode transparent conductive layer are deposited successively on the substrate after step 405. A photoresist layer is applied uniformly thereon, and subjected to an exposing and developing process using a dual tone mask.

Figure 5F:
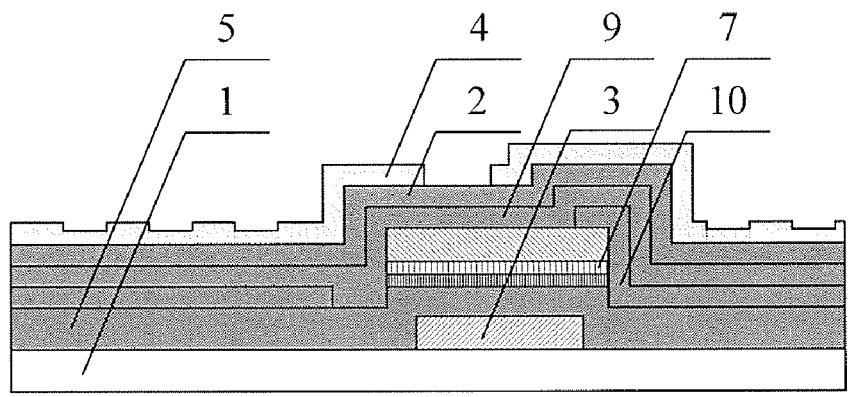
FIG. 5f is a schematic cross sectional view of the substrate after step 406 according to the fourth embodiment of the present invention.

FIG. 5f is a schematic view of the substrate after step 406 according to the fourth embodiment of the present invention. As shown in FIG. 5f, after the photoresist layer 4 is exposed and developed, the common electrode transparent conductive layer 2 is exposed in a thin film transistor region, and the photoresist layer 4 is relatively thin in a slit region of the display region while the photoresist layer 4 is relatively thick in the other regions.

In step 407, the common electrode transparent conductive layer, the passivation layer, the doped semiconductor layer and part of the semiconductor layer are etched successively.

Figure 5G:
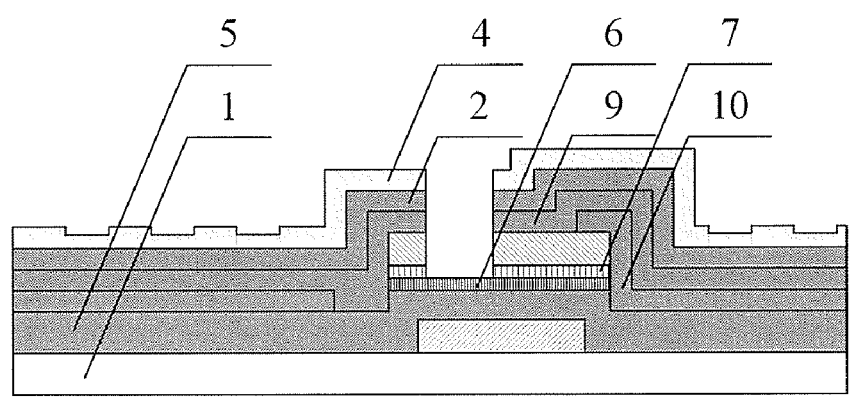
FIG. 5g is a schematic cross sectional view of the substrate after step 407 according to the fourth embodiment of the present invention.

FIG. 5g is a schematic view of the substrate after step 407 according to the fourth embodiment of the present invention. As shown in FIG. 5g, after the common electrode transparent conductive layer 2, the passivation layer 9, the doped semiconductor layer 7 and part of the semiconductor layer 6 are etched successively, the semiconductor layer 6 is exposed in the channel region of the thin film transistors so that the channels of the thin film transistors are formed.

In step 408, a part of the photoresist layer is removed by ashing.

Figure 5H:
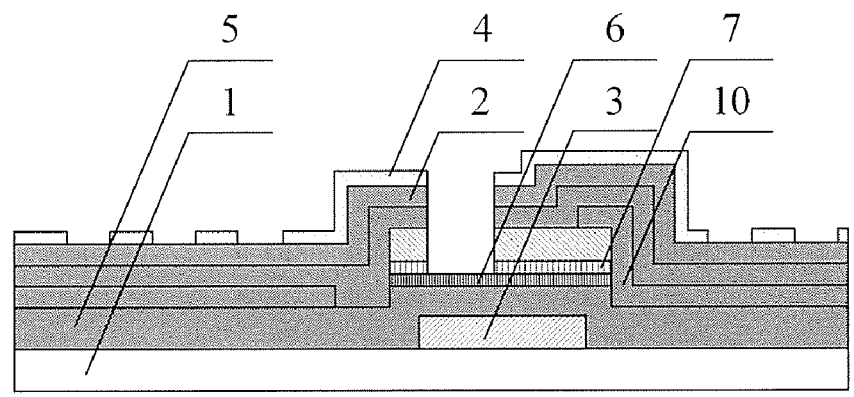
FIG. 5h is a schematic cross sectional view of the substrate after step 408 according to the fourth embodiment of the present invention.

FIG. 5h is a schematic view of the substrate after step 408 according to the fourth embodiment of the present invention. As shown in FIG. 5h, after a part of the photoresist layer is removed by ashing, the common electrode transparent conductive layer 2 in the slit region is exposed.

In step 409, the common electrode transparent conductive layer exposed by the photoresist layer is etched.

Figure 5I:
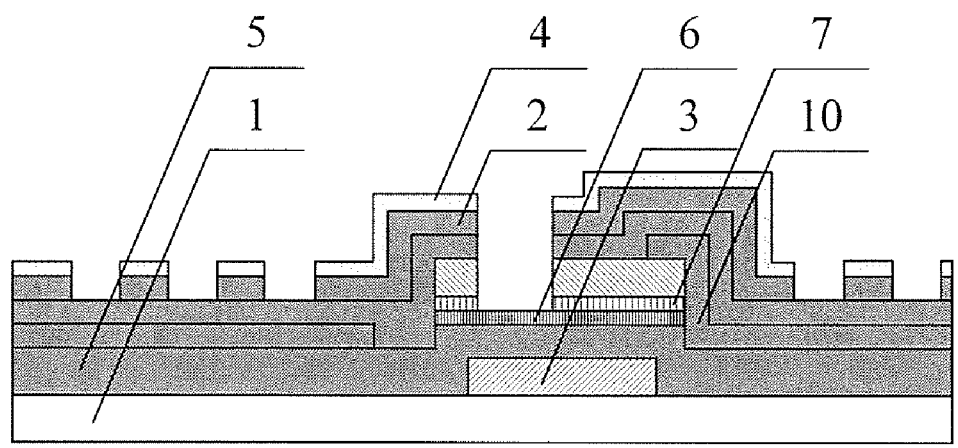
FIG. 5i is a schematic cross sectional view of the substrate after step 409 according to the fourth embodiment of the present invention.

FIG. 5i is a schematic view of the substrate after step 409 according to the fourth embodiment of the present invention. As shown in FIG. 5i, after the common electrode transparent conductive layer 2 is etched, common electrodes with slits are formed.

In step 410, the photoresist layer is stripped.

Figure 5J:
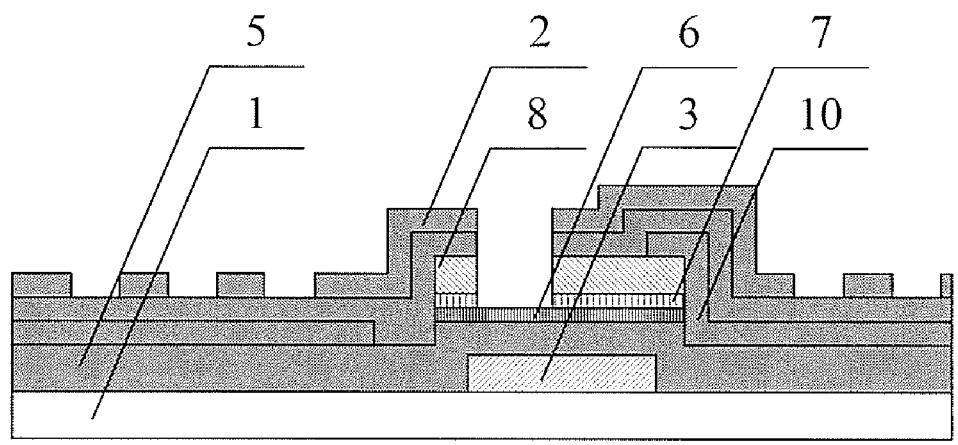
FIG. 5j is a schematic cross sectional view of the substrate after step 410 according to the fourth embodiment of the present invention.

FIG. 5j is a schematic view of the substrate after step 410 according to the fourth embodiment of the present invention. As shown in FIG. 5j, after step 410, the photoresist layer on the common electrodes is stripped. Thus, the manufacturing of an array substrate for a liquid crystal display device is completed.

The fourth embodiment provides an array substrate of a fringe field switching type for a liquid crystal display device. In particular, the pixel electrodes are plate-like electrodes, and the common electrodes are slit electrodes, so that a horizontal electric field is generated by the common electrodes with slits located on the upper side, thereby obtaining an array substrate of a fringe field switching type for a liquid crystal display device.

Furthermore, a transflective array substrate for a liquid crystal display device can be made, if the gate metal layer is formed in a portion of the display region in the step of forming gate lines and common electrodes. A gate metal layer with high reflectivity, such as aluminum, may be deposited in step 401 to enhance the reflectivity. Metal material with a reflectivity over 30% is preferred.

Those skilled in the art will understand, the thin film patterning method according to the first embodiment can be applied not only to the step of forming gate lines and common electrodes, but also to the step of forming data lines and pixel electrodes, and the thin film patterning method according to the first embodiment can be used in both of these two step simultaneously.

The embodiment of the invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A method for manufacturing a liquid crystal display device comprising
    step 1 of depositing a common electrode transparent conductive layer on a substrate, and applying a photoresist layer on the common electrode transparent conductive layer;
    step 2 of exposing and developing the photoresist layer using a dual tone mask to define a first region, a second region and a third region, wherein the photoresist layer in the first region is thicker than the photoresist layer in the second region and there is no photoresist layer left in the third region;
    step 3 of over-etching the common electrode transparent conductive layer to remove the common electrode transparent conductive layer in the third region and form an over-etched region in the peripheral region of the first region;
    step 4 of removing a part of the photoresist layer by ashing to expose the common electrode transparent conductive layer in the second region;
    step 5 of depositing a gate metal layer so that the common electrode transparent conductive layer contacts the gate metal layer in the second region;
    step 6 of lifting off the photoresist layer to remove the gate metal layer in the first region and exposing the substrate in the over-etched region of the first region, thereby forming gate lines, common electrode lines, and common electrodes contacting the common electrode lines;
    step 7 of forming thin film transistors comprising a source/drain electrode metal layer on the substrate; and
    step 8 of forming pixel electrodes on the substrate.

2. The thin film patterning method of claim 1, wherein in step 3, a pattern composed of the common electrode transparent conductive layer is formed in a peripheral region of the first region adjacent to the second region.

3. The thin film patterning method of claim 1, wherein in step 3, the substrate is exposed in a peripheral region of the first region adjacent to the third region.

4. The thin film patterning method of claim 1, wherein in step 3, the common electrode transparent conductive layer is over-etched by a wet etching process.

5. The thin film patterning method of claim 4, wherein in step 3, the common electrode transparent conductive layer has a bias of 3 µm or more by said over-etching.

* * * * *